(12) United States Patent
Fung et al.

(10) Patent No.: US 11,005,441 B2
(45) Date of Patent: May 11, 2021

(54) AUDIO/VIDEO POWER PROCESSOR AND AUDIO/VIDEO PLAYBACK SYSTEM

(71) Applicant: Tsz Cheung Fung, New Territories (HK)

(72) Inventors: Tsz Cheung Fung, New Territories (HK); Kin Ki Lee, Kowloon (HK)

(*) Notice: Subject to any disclaimer, the term of this patent is extended or adjusted under 35 U.S.C. 154(b) by 244 days.

(21) Appl. No.: 16/110,323

(22) Filed: Aug. 23, 2018

(65) Prior Publication Data
US 2019/0393851 A1 Dec. 26, 2019

(30) Foreign Application Priority Data
Jun. 22, 2018 (CN) .......................... 201810652831.5

(51) Int. Cl.
| | |
|---|---|
| *H03H 7/01* | (2006.01) |
| *G06F 3/16* | (2006.01) |
| *H01F 27/28* | (2006.01) |
| *H05K 5/04* | (2006.01) |
| *H01F 27/40* | (2006.01) |

(52) U.S. Cl.
CPC ........... *H03H 7/0115* (2013.01); *G06F 3/162* (2013.01); *H01F 27/2823* (2013.01); *H01F 27/40* (2013.01); *H05K 5/04* (2013.01)

(58) Field of Classification Search
CPC ... H03H 7/0115; H01F 27/2823; H01F 27/40; G06F 3/162; H05K 5/04; H02M 1/44; H02M 1/126; G10K 11/16; H04N 5/63

USPC .......................................................... 361/270
See application file for complete search history.

(56) References Cited

U.S. PATENT DOCUMENTS

| | | | | |
|---|---|---|---|---|
| 2012/0153857 A1* | 6/2012 | Han | .................. | H02M 1/44 |
| | | | | 315/224 |
| 2014/0268615 A1* | 9/2014 | Yun | .................. | H05K 3/10 |
| | | | | 361/782 |
| 2017/0110776 A1* | 4/2017 | Liu | .................. | G06F 17/11 |

* cited by examiner

*Primary Examiner* — Dharti H Patel
(74) *Attorney, Agent, or Firm* — Porzio Bromberg & Newman P.C.

(57) ABSTRACT

An audio/video power processor for an audio/video playback device, and an audio/video playback system. The audio/video power processor for an audio/video playback device includes: a box having a grounded metal shell; an electric power input port for receiving AC electric power, the electric power input port comprising a first live line terminal and a first null line terminal; an electric power output port for outputting electric power to the audio/video playback device, the electric power output port comprising a second live line terminal and a second null line terminal; a first capacitor unit electrically connected between the first live line terminal and the first null line terminal; a first inductor electrically connected between the first live line terminal and the second live line terminal; and a second inductor electrically connected between the first null line terminal and the second null line terminal. The audio/video power processor has the advantage of improving the playback performance of the audio/video playback device.

20 Claims, 4 Drawing Sheets

AUDIO/VIDEO POWER PROCESSOR AND AUDIO/VIDEO PLAYBACK SYSTEM

TECHNICAL FIELD

The disclosure relates generally to power supplies, and particularly to an audio/video power processor for an audio/video playback device, and an audio/video playback system using the audio/video power processor.

BACKGROUND ART

At present, audio/video playback devices are common electronic products. To improve users' experience, it is desirable in the art to improve the playback performance of the audio/video playback devices.

SUMMARY OF THE INVENTION

A brief summary of the disclosure is given below to provide a basic understanding to some aspects of the disclosure. It should be understood that the summary is not exhaustive. It does not intend to define a key or important part of the disclosure, nor does it intend to limit the scope of the disclosure. The object of the summary is only to present some concepts, in a simplified manner, as a preamble of the more detailed description that follows.

It is recognized by the inventor that: if electric power received by an audio/video playback device is polluted, for example has an interference component, the playback performance of the audio/video playback device will be deteriorated.

In view of the foregoing problem, the following technical solution is designed.

According to one aspect of the disclosure, there is provided an audio/video power processor for an audio/video playback device, comprising: a box having a grounded metal shell; an electric power input port for receiving AC electric power, the electric power input port comprising a first live line terminal and a first null line terminal; an electric power output port for outputting electric power to the audio/video playback device, the electric power output port comprising a second live line terminal and a second null line terminal; a first capacitor unit electrically connected between the first live line terminal and the first null line terminal; a first inductor electrically connected between the first live line terminal and the second live line terminal; and a second inductor electrically connected between the first null line terminal and the second null line terminal; wherein the first inductor or the second inductor is positioned such that energy induced by a varying magnetic field generated by the first inductor or the second inductor can be absorbed through the metal shell.

According to one aspect of the disclosure, there is provided an audio/video playback system, comprising: the aforementioned audio/video power processor; and the audio/video playback device.

The technical solution of the disclosure at least has the beneficial technical effect of: improving the playback performance of the audio/video playback device.

BRIEF DESCRIPTION OF THE DRAWINGS

The disclosure could be better understood with reference to the descriptions made in combination with the appended drawings hereinafter. It should be appreciated that the appended drawings is not necessarily scaled. In the appended drawings.

DETAILED DESCRIPTION OF THE EMBODIMENTS

Figure 1:
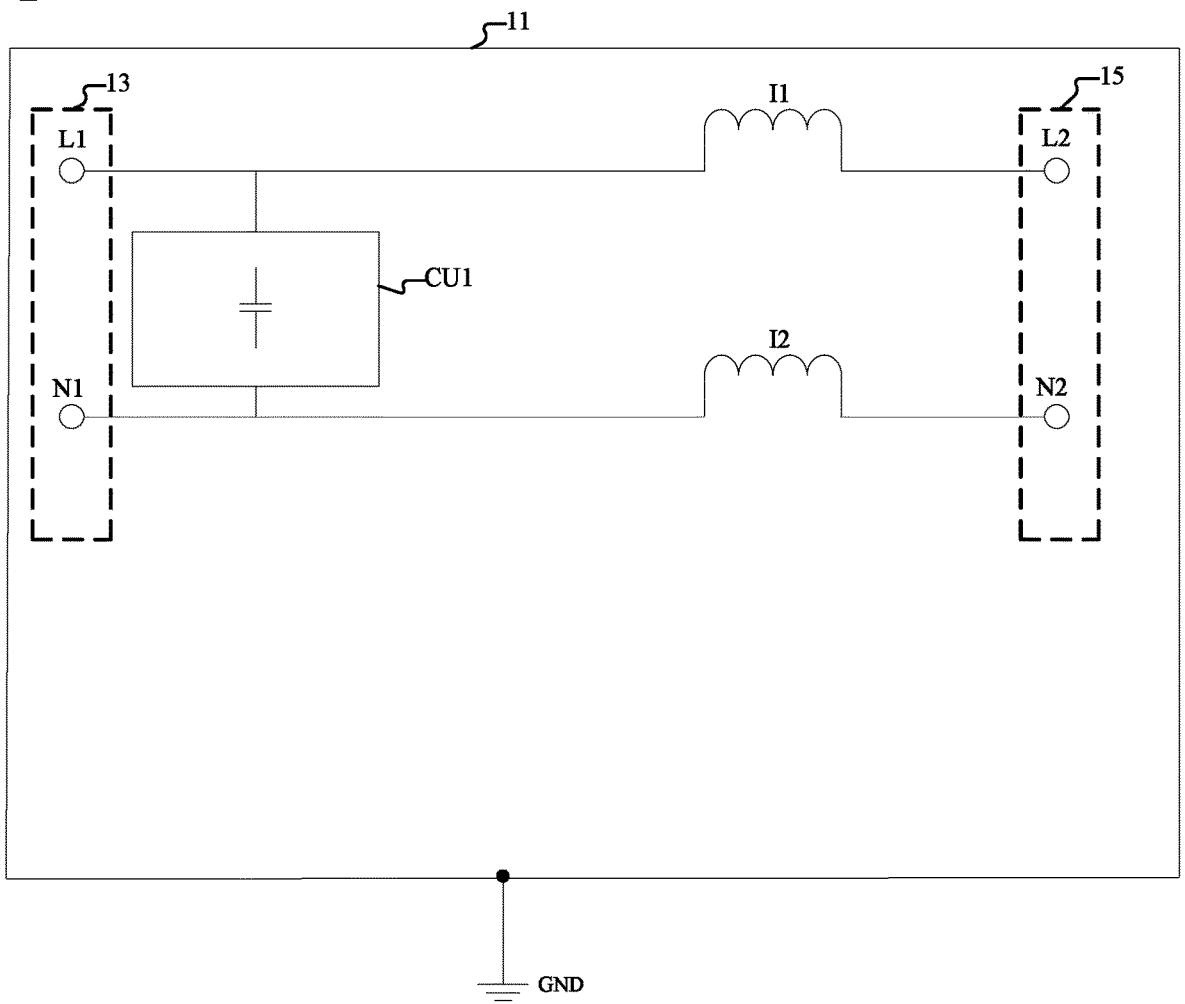
FIG. 1 is a schematic view of the structure of an audio/video power processor for an audio/video playback device according to an embodiment of the disclosure.

Exemplary embodiments of the disclosure will be described in combination with the appended drawings below. For the sake of clarity and conciseness, the specification does not describe all features of actual embodiments. However, it should be understood that in developing any such an actual embodiment, many decisions specific to the embodiment may be made, so as to achieve specific objects of a developer, and these decisions possibly vary as embodiments are different.

It should also be noted that, to avoid the disclosure from being obscured due to unnecessary details, only those device structures closely related to the solutions according to the disclosure are shown in the appended drawings, while other details not closely related to the disclosure are omitted.

A conventional audio/video playback device will receive AC city power, as working electric power, through an electric power input interface. Due to changes in the switching and electricity consumption of an electrical appliance, the electric power input interface causes electric power received by the audio/video playback device on the same electric power input interface not to be a sinusoidal wave of a single normal frequency (e.g., 50 Hz). Rather, within one sinusoidal wave, there are many high-frequency interference waves having wave amplitudes of unfixed magnitude. These interference waves cause deterioration in a playback effect of the audio/video playback device designed to operate at a sinusoidal wave of 50 Hz. Generally, an audio/video power processor or an isolator will also produce other interference while processing input electric power, such that the audio/video playback device also suffers from extra interference such as electromagnetic waves or magnetic fields while receiving the processed electric power. To improve the playback performance of the audio/video playback device, an audio/video power processor which does not suffer from any influence from the outside and meanwhile does not influence the audio/video playback device is desired.

The disclosure provides an audio/video power processor for an audio/video playback device. The technical solution of the present invention can process polluted AC electric power into sinusoidal wave electric power having a single frequency by filtering out high-frequency components, and provide the processed electric power to the audio/video playback device, so as to improve the playback performance of the audio/video playback device.

Specifically, the disclosure provides an audio/video power processor for an audio/video playback device, comprising: a box having a grounded metal shell; an electric power input port for receiving AC electric power, the electric power input port comprising a first live line terminal and a first null line terminal; an electric power output port for outputting electric power to the audio/video playback device, the electric power output port comprising a second live line terminal and a second null line terminal; a first capacitor unit electrically connected between the first live line terminal and the first null line terminal; a first inductor electrically connected between the first live line terminal and the second live line terminal; and a second inductor electrically connected between the first null line terminal and the second null line terminal; wherein the first inductor or the second inductor is positioned such that energy induced by a varying magnetic field generated by the first inductor or the second inductor can be absorbed through the metal shell.

FIG. 1 is a schematic view of the structure of an audio/video power processor 1 for an audio/video playback device according to an embodiment of the disclosure.

As shown in FIG. 1, the audio/video power processor 1 comprises: a box, an electric power input port 13, an electric power output port 15, a first capacitor unit CU1, a first inductor I1 and a second inductor I2. The box has a grounded (GND) metal shell 11. A material of the metal shell 11 is an electrically conductive metal, such as brass or red bronze. The material of the metal shell 11 is preferably brass. The electric power input port 13, the electric power output port 15, the first capacitor unit CU1, the first inductor I1 and the second inductor I2 are arranged within the metal shell 11. The metal shell 11 can shield interference of external interference signals to electric power outputted from the audio/video power processor 1. The electric power input port 13 is used for receiving AC electric power, such as AC city power. The electric power input port 13 comprises a first live line terminal L1 and a first null line terminal N1. The electric power input port 13 is preferably an IEC socket. The electric power output port 15 is used for outputting electric power to the audio/video playback device. The electric power output port 15 comprises a second live line terminal L2 and a second null line terminal N2. The electric power output port 15 is for example a socket. The first capacitor unit CU1 is electrically connected between the first live line terminal L1 and the first null line terminal N1. By utilizing the characteristics of capacitors passing high frequencies and resisting low frequencies, the capacitor unit CU1 transmits abnormal high-frequency electric power components in the live line to the null line, so as to neutralize the abnormal high-frequency electric power components, purifying the frequency of the output electric power. The first inductor I1 is electrically connected between the first live line terminal L1 and the second live line terminal L2. The second inductor I2 is electrically connected between the first null line terminal N1 and the second live line terminal N2. By utilizing the characteristics of inductors passing low frequencies and resisting high frequencies, the first inductor I1 and the second inductor I2 can impede transmission of abnormal high-frequency electric power components to the audio/video playback device. The first inductor I1 or the second inductor I2 is positioned such that energy induced by a varying magnetic field generated by the first inductor I1 or the second inductor I2 can be absorbed through the metal shell 11. For example, the first inductor I1 is placed such that: a bobbin of the first inductor I1 for winding a winding is perpendicular to a top surface and a bottom surface of the metal shell 11; and the second inductor I2 is placed such that: a bobbin of the second inductor I2 for winding a winding is perpendicular to the top surface and the bottom surface of the metal shell 11.

To prevent the two inductors from interfering to each other, the bobbin of the first inductor I1 for winding the winding of the first inductor I1 and the bobbin of the second inductor I2 for winding the winding of the second inductor I2 are separate from each other. Diameters of the respective bobbins are for example 4.3 centimeters. Preferably, inductances of the first inductor I1 and the second inductor I2 are the same.

The metal shell 11 is preferably a cuboid, for example with its length=16 inches, with its width=13 inches, and with its height=4 inches (1 inch=2.54 centimeters). A length of a wire of the winding of the first inductor I1 is preferably an integral multiple of 8 feet (1 feet=0.3048 meter), for example 16 feet. A length of a wire of the winding of the second inductor I2 is preferably an integral multiple of 8 feet, for example 16 feet. The lengths selected as such are advantageous to improving the playback performance of the audio/video playback device.

To improve the stability of electric potential of the metal shell of the box, an active ground unit may be arranged.

Figure 2:
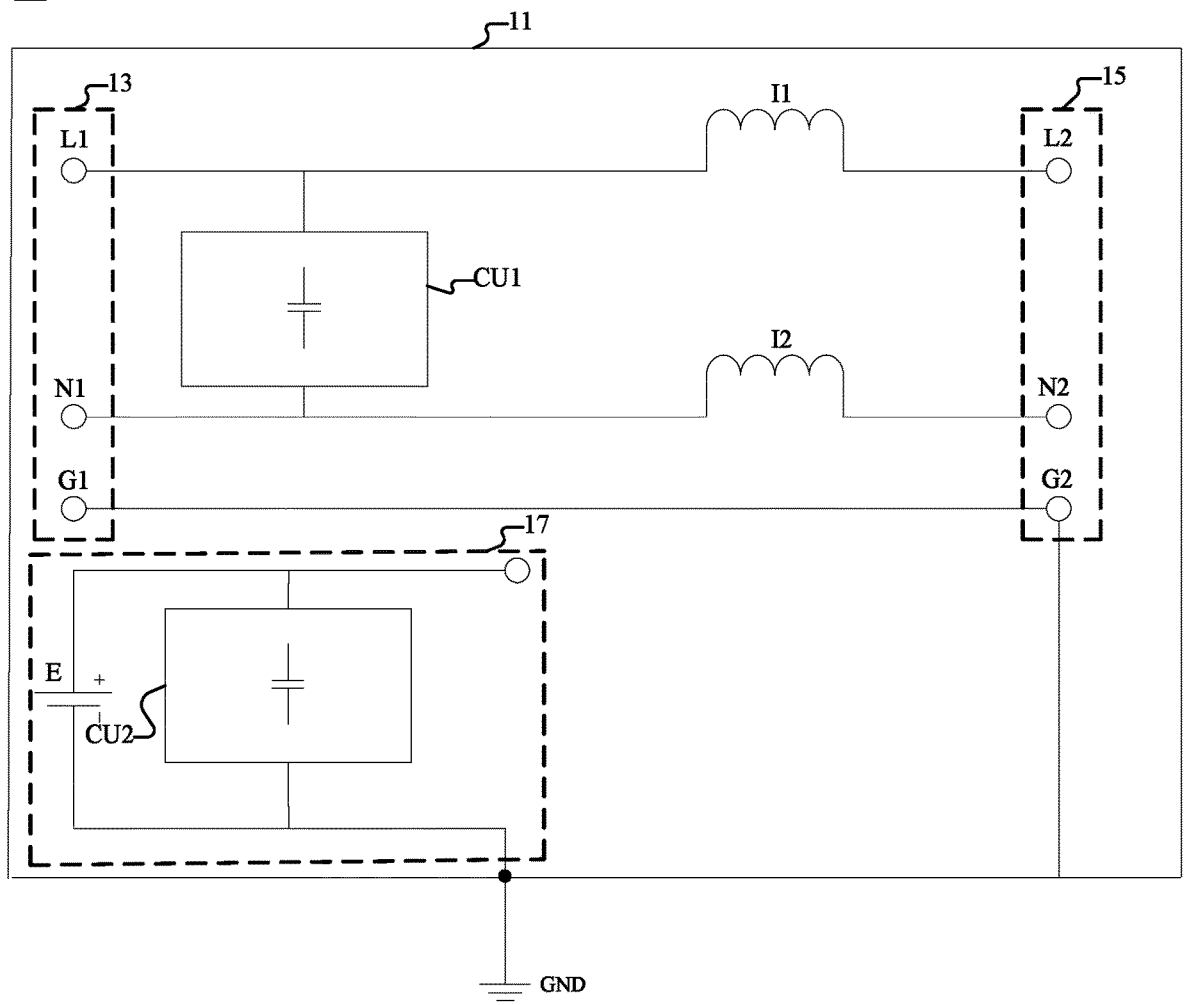
FIG. 2 is a schematic view of the structure of the structure of an audio/video power processor for an audio/video playback device according to an embodiment of the disclosure.

FIG. 2 is a schematic view of the structure of the structure of an audio/video power processor 1a for an audio/video playback device according to an embodiment of the disclosure.

Like the audio/video power processor 1, the audio/video power processor 1a has a box, an electric power input port 13, an electric power output port 15, a first capacitor unit CU1, a first inductor I1 and a second inductor I2; wherein the box has a grounded metal shell 11. Unlike the audio/video power processor 1, the audio/video power processor 1a further has an active ground unit 17. The active ground unit 17 comprises a battery E and a second capacitor unit CU2 electrically connected between a positive pole of the battery E and a negative pole of the battery E, and the negative pole is electrically connected with the metal shell 11. The second capacitor CU2 can improve the stability of electric potential of the metal shell 11. The active ground unit 17 is arranged within the metal shell 11.

Preferably, the electric input ports 13 of the audio/video power processors 1a and 1 may have a first ground terminal G1, and the electric power output ports 15 of the audio/video power processors 1a and 1 may have a second ground terminal G2. The second ground terminal G2 is electrically connected with the metal shell 11, and the second ground terminal G2 is preferably electrically connected with the first ground terminal G1 directly.

Preferably, a nominal electromotive force of the battery E may be selected as 5-10 volts (e.g., 9 volts).

To reduce the influence of the inductors upon the capacitor units, a baffle may be arranged within the metal shell, so as to divide the metal shell into two spaces.

Figure 3:
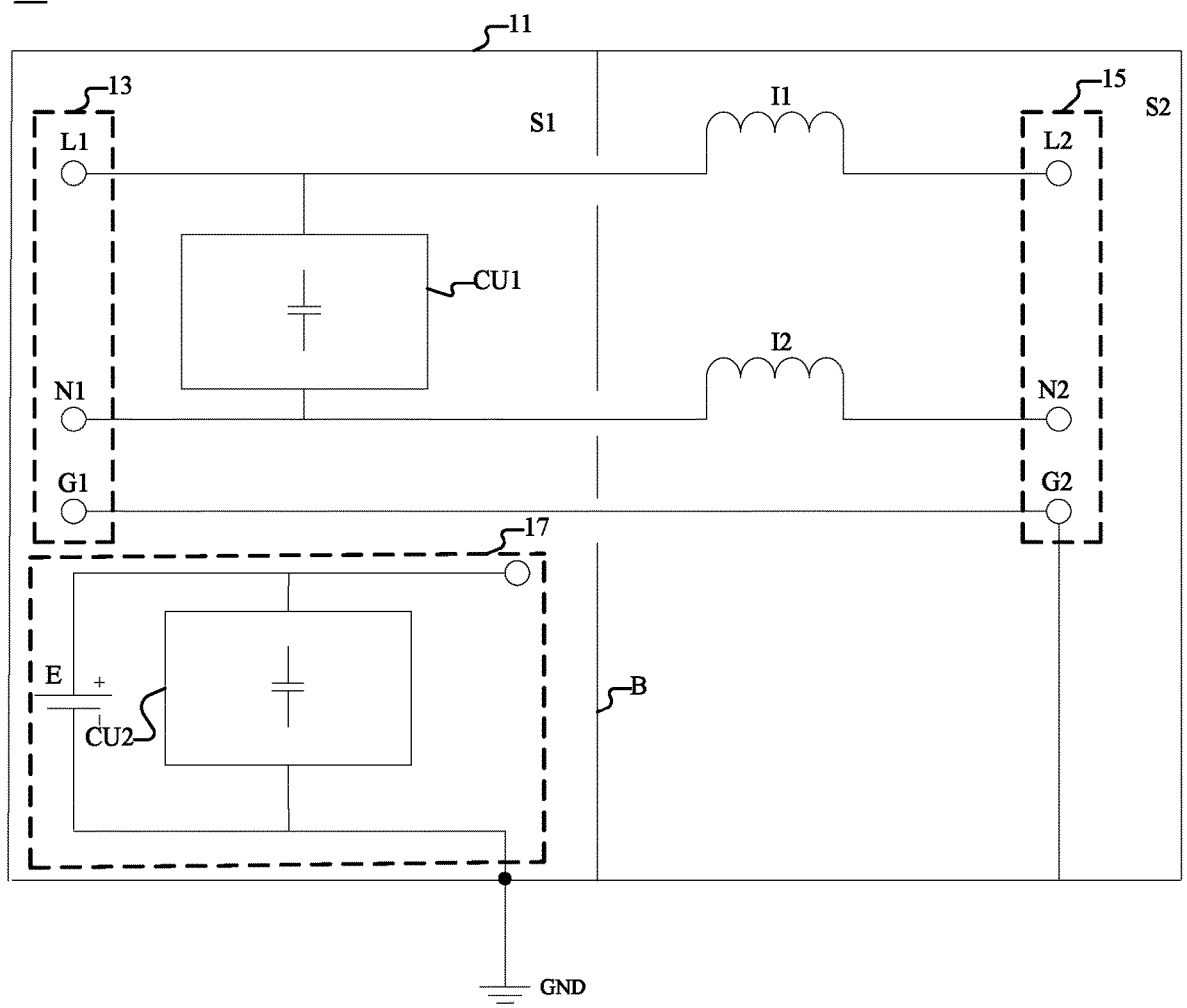
FIG. 3 is a schematic view of the structure of the structure of an audio/video power processor for an audio/video playback device according to an embodiment of the disclosure.

FIG. 3 is a schematic view of the structure of the structure of an audio/video power processor 1b for an audio/video playback device according to an embodiment of the disclosure.

Like the audio/video power processor 1a, the audio/video power processor 1b has a box, an electric power input port 13, an electric power output port 15, a first capacitor unit CU1, an active ground unit 17, a first inductor I1 and a second inductor I2; wherein the box has a grounded metal shell 11. Unlike the audio/video power processor 1a, the metal shell 11 of the audio/video power processor 1b further has a metal baffle B. The metal baffle B divides the metal shell 11 into a first space S1 and a second space S2. The electric power input port 13 and the active ground unit 17 are arranged within the first space S1. The first inductor I1, the second inductor I2 and the electric power output port 15 are arranged within the second space S2.

The first space S1 and the second space S2 preferably have equal sizes.

To improve the effect of neutralizing abnormal high-frequency electric power components, a plurality of capacitors may be arranged in the capacitor unit.

Figure 4:
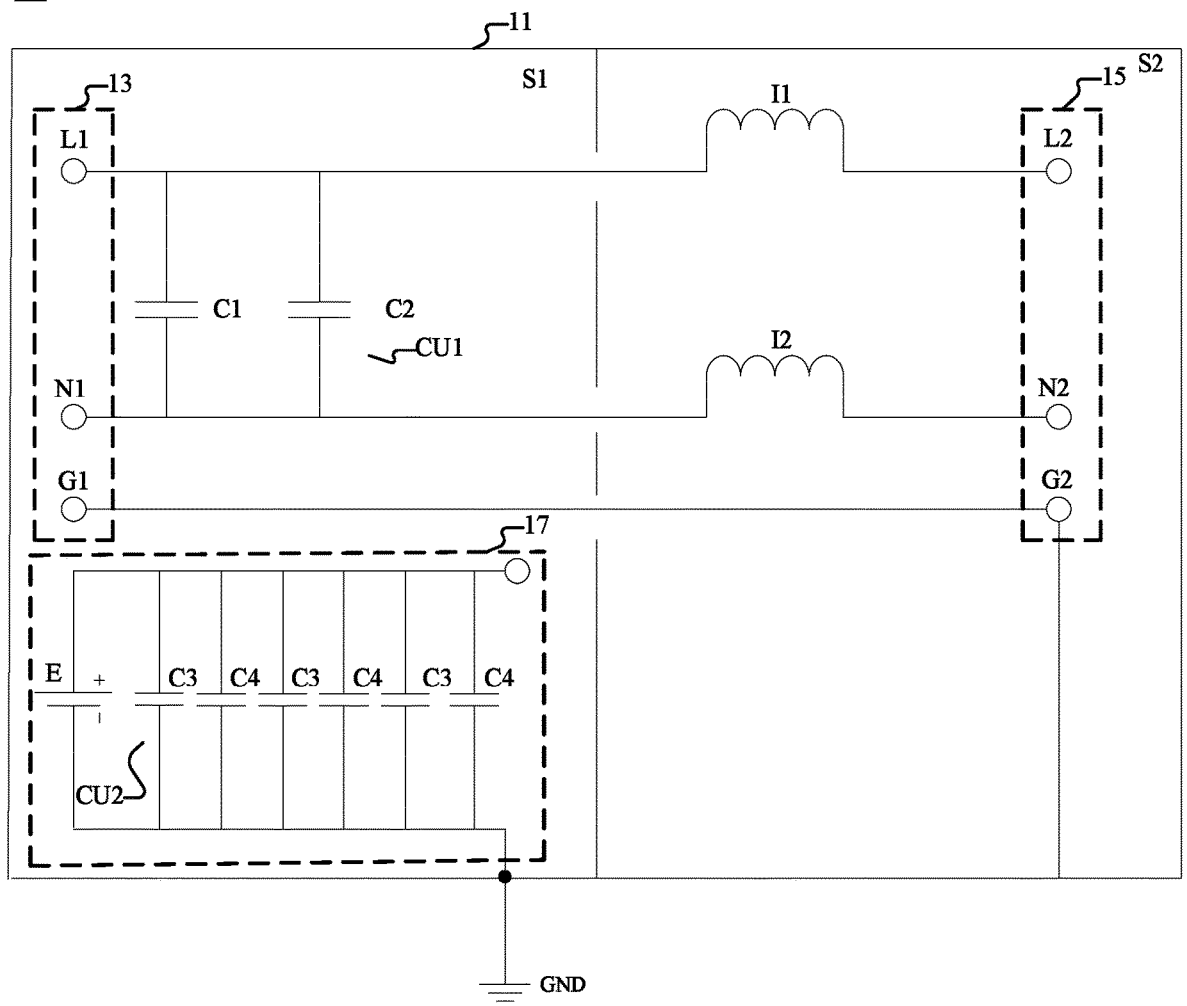
FIG. 4 is a schematic view of the structure of the structure of an audio/video power processor for an audio/video playback device according to another embodiment of the disclosure.

FIG. 4 is a schematic view of the structure of the structure of an audio/video power processor 1c for an audio/video playback device according to another embodiment of the disclosure.

In the following descriptions of FIG. 4, portions which are the same as those in the descriptions of FIG. 3 will not be repeated. As shown in FIG. 4, the first capacitor unit CU1 is schematically composed of a first capacitor C1 and a second capacitor C2, and the first capacitor C1 is connected in parallel with the second capacitor C2. A capacitance of the first capacitor CU1 is preferably 0.1 to 1 microfarad. As an example, the capacitance of the first capacitor CU1 is 0.05-0.57 microfarad (e.g., 0.47 microfarad); and a capacitance of the second capacitor is 0.05-0.43 microfarad (e.g., 0.1 microfarad). The number of the capacitors composing the first capacitor unit CU1 is not limited to two, but may be more or less, such as 1, 3, 4 or 5. Capacitances of the capacitors composing the first capacitor unit CU1 may be either the same or different.

The second capacitor unit CU2 may also be composed of a plurality of capacitors. For example, the second capacitor unit CU2 is composed of two or more types of capacitors. For example, the second capacitor unit CU2 is composed of a first capacitor sub-unit and a second capacitor sub-unit. The first capacitor sub-unit is composed of several capacitors of the same magnitude of capacitance. The second capacitor sub-unit is composed of several capacitors of another the same magnitude of capacitance. In one example, a capacitance of the first capacitor sub-unit may be 10000-50000 microfarads (e.g., 30000 microfarads), and a capacitance of the second capacitor sub-unit may be 1.00-1.70 microfarads (e.g., 1.41 microfarads). Preferably, rated voltages of the first capacitor sub-unit and the second capacitor sub-unit are the same, and a ratio of a capacitance of the first capacitor sub-unit to a capacitance of the second capacitor sub-unit is between 10000 and 30000. In FIG. 4, as an example, the first capacitor sub-unit is composed of three same capacitors C3, a rated voltage of each capacitor C3 is 50-280 V (e.g., 63 V), and a capacitance of each capacitor C3 is 3300-16700 microfarads (e.g., 10000 microfarads); the second capacitor sub-unit is composed of three same capacitors C4, a rated voltage of each capacitor C4 is 50-280 V (e.g., 63 V), and a capacitance of each capacitor C4 is 0.33-0.55 microfarads (e.g., 0.47 microfarads). The number of the capacitors composing the first capacitor sub-unit is not limited to three, but may be more or less. The number of the capacitors composing the second capacitor sub-unit is not limited to three, but may be more or less. The capacitor C4 may be selected as an electrolytic capacitor.

The disclosure further provides an audio/video playback system.

Figure 5:
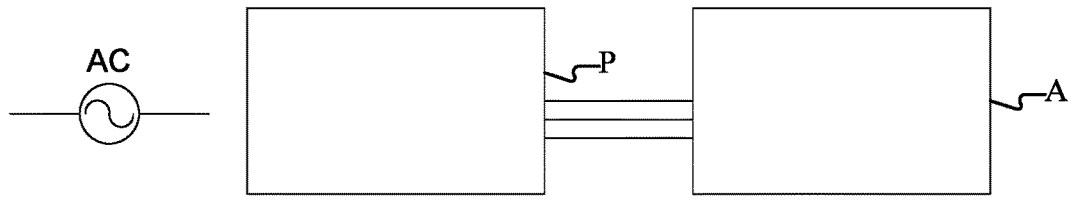
FIG. 5 is a schematic block diagram of an audio/video playback system according to an embodiment of the disclosure.

FIG. 5 is a schematic block diagram of an audio/video playback system 10 according to an embodiment of the disclosure.

The audio/video playback system 10 comprises: an audio/video power processor P and an audio/video playback device A. The audio/video power processor P may be the audio/video power processor 1, 1a, 1b, 1c described above in the disclosure, or a variant thereof. The audio/video playback device A may be a conventional audio/video playback device, which can receive electric power provided by an external power supply and play audio/video data. By connecting an electric power input port of the audio/video power processor P with AC electric power and connecting an electric power output port of the audio/video power processor P with an electric power input port of the audio/video playback device A, it is made possible to provide high-quality electric power to the audio/video playback device A, so as to improve the playback performance of the audio/video playback device.

Embodiments of the disclosure are not limited to the above detailed embodiments. Those skilled in the art would appreciate that proper amendments may be made without departing from the principle of the disclosure. For example, the number of the electric power input port is more than one, and may be more.

It should be understood that the different embodiments or features described in the disclosure may be combined, where feasible, unless otherwise indicated.

Although the disclosure has been disclosed above by describing the detailed embodiments of the disclosure, it should be understood that those skilled in the art could carry out various modifications, improvements or equivalents for the disclosure within the spirit and scope of the appended claims. Such modifications, improvements or equivalents should also be regarded as being included within the scope of protection of the disclosure.

It should be emphasized that when being used herein, terms "include/comprise" indicate existence of features, elements or assemblies, without excluding existence or addition of one or more other features, elements or assemblies.

The invention claimed is:

1. An audio/video power processor for an audio/video playback device, comprising:
    a box having a grounded metal shell;
    an electric power input port for receiving AC electric power, the electric power input port comprising a first live line terminal and a first null line terminal;
    an electric power output port for outputting electric power to the audio/video playback device, the electric power output port comprising a second live line terminal and a second null line terminal;
    a first capacitor unit electrically connected between the first live line terminal and the first null line terminal;
    a first inductor electrically connected between the first live line terminal and the second live line terminal;
    a second inductor electrically connected between the first null line terminal and the second null line terminal; and
    an active ground unit, wherein the active ground unit comprises a battery and a second capacitor unit electrically connected between a positive pole of the battery and a negative pole of the battery, and the negative pole is electrically connected with the metal shell and wherein the first inductor or the second inductor is positioned such that energy induced by a varying magnetic field generated by the first inductor or the second inductor can be absorbed through the metal shell.

2. The audio/video power processor according to claim 1, wherein the metal shell is divided into a first space and a second space through a metal baffle.

3. The audio/video power processor according to claim 2, wherein the electric power input port further comprises a first ground terminal, and the electric power input port is mounted in the first space;
the electric power output port further comprises a second ground terminal;
the first capacitor unit is arranged in the first space;
the first inductor and the second inductor are arranged in the second space; and
the active ground unit is arranged in the first space.

4. The audio/video power processor according to claim 3, wherein the second ground terminal is electrically connected with the metal shell, and the second ground terminal is electrically connected with the first ground terminal directly.

5. An audio/video power processor for an audio/video playback device, comprising:
a box having a grounded metal shell;
an electric power input port for receiving AC electric power, the electric power input port comprising a first live line terminal and a first null line terminal;
an electric power output port for outputting electric power to the audio/video playback device, the electric power output port comprising a second live line terminal and a second null line terminal;
a first capacitor unit electrically connected between the first live line terminal and the first null line terminal;
a first inductor electrically connected between the first live line terminal and the second live line terminal; and
a second inductor electrically connected between the first null line terminal and the second null line terminal,
wherein the first inductor or the second inductor is positioned such that energy induced by a varying magnetic field generated by the first inductor or the second inductor can be absorbed through the metal shell and a capacitance of the first capacitor unit is 0.1 to 1 microfarad.

6. The audio/video power processor according to claim 5, wherein the first capacitor unit is composed of a first capacitor and a second capacitor, the first capacitor is connected in parallel with the second capacitor, a capacitance of the first capacitor is 0.05-0.57 microfarad, and a capacitance of the second capacitor is 0.05-0.43 microfarad.

7. The audio/video power processor according to claim 1, wherein a nominal electromotive force of the battery is 5-10 volts.

8. The audio/video power processor according to claim 1, wherein the second capacitor unit is composed of a first capacitor sub-unit and a second capacitor sub-unit, rated voltages of the first capacitor sub-unit and the second capacitor sub-unit are the same, and a ratio of a capacitance of the first capacitor sub-unit to a capacitance of the second capacitor sub-unit is between 10000 and 30000.

9. The audio/video power processor according to claim 8, wherein the rated voltages of the first capacitor sub-unit and the second capacitor sub-unit are 50-280 volts.

10. The audio/video power processor according to claim 8, wherein the capacitance of the first capacitor sub-unit is 10000-50000 microfarads.

11. The audio/video power processor according to claim 10, wherein the first capacitor sub-unit is composed of three same third capacitors, the second capacitor sub-unit is composed of three same fourth capacitors.

12. The audio/video power processor according to claim 11, wherein the third capacitor is an electrolytic capacitor.

13. The audio/video power processor according to claim 2, wherein the first space and the second space have equal sizes.

14. The audio/video power processor according to claim 5, wherein a material of the metal shell is copper.

15. The audio/video power processor according to claim 14, wherein the material of the metal shell is brass.

16. The audio/video power processor according to claim 5, wherein a bobbin of the first inductor for winding a winding of the first inductor and a bobbin of the second inductor for winding a winding of the second inductor are separate from each other.

17. The audio/video power processor according to claim 5, wherein inductances of the first inductor and the second inductor are the same.

18. The audio/video power processor according to claim 17, wherein the metal shell is a cuboid, a length of a wire of the winding of the first inductor is an integral multiple of 8 feet.

19. The audio/video power processor according to claim 5, wherein the electric power input port is an IEC socket.

20. An audio/video playback system, comprising:
the audio/video power processor according to claim 5; and the audio/video playback device.

* * * * *